(12) United States Patent
Bromfield

(10) Patent No.: US 7,627,936 B2
(45) Date of Patent: Dec. 8, 2009

(54) METHODS OF MANUFACTURE OF A TRANSDUCER DEVICES ACTUATORS

(75) Inventor: George Bromfield, Salt Lake City, UT (US)

(73) Assignee: PiezoInnovations, Salt Lake City, UT (US)

( * ) Notice: Subject to any disclaimer, the term of this patent is extended or adjusted under 35 U.S.C. 154(b) by 0 days.

(21) Appl. No.: 11/657,194

(22) Filed: Jan. 23, 2007

(65) Prior Publication Data

US 2007/0170820 A1 Jul. 26, 2007

Related U.S. Application Data

(60) Provisional application No. 60/761,178, filed on Jan. 23, 2006.

(51) Int. Cl.
*H01L 41/22* (2006.01)
*H01L 41/00* (2006.01)

(52) U.S. Cl. .................. 29/25.35; 29/594; 29/595; 29/831; 29/832; 310/311

(58) Field of Classification Search ............... 29/25.35, 29/594, 595, 832, 837, 854, 855; 310/364, 310/369, 365, 367, 313 A; 128/200.16; 606/159, 606/459, 439; 433/119
See application file for complete search history.

(56) References Cited

U.S. PATENT DOCUMENTS

| | | | | |
|---|---|---|---|---|
| 3,376,438 A | * | 4/1968 | Colbert | 310/327 |
| 4,211,948 A | * | 7/1980 | Smith et al. | 310/322 |
| 4,786,837 A | * | 11/1988 | Kalnin et al. | 310/364 |
| 4,841,977 A | * | 6/1989 | Griffith et al. | 600/439 |
| 4,877,745 A | | 10/1989 | Hayes et al. | |
| 4,999,819 A | * | 3/1991 | Newnham et al. | 367/157 |
| 5,288,551 A | * | 2/1994 | Sato et al. | 428/334 |
| 5,456,259 A | * | 10/1995 | Barlow et al. | 600/459 |
| 5,749,727 A | * | 5/1998 | Dao et al. | 433/119 |
| 5,798,599 A | | 8/1998 | Barwood | |
| 6,107,726 A | * | 8/2000 | Near et al. | 310/328 |
| 6,585,745 B2 | * | 7/2003 | Cimino | 606/169 |
| 6,662,418 B1 | * | 12/2003 | Yun et al. | 29/25.35 |
| 2003/0020377 A1 | | 1/2003 | Namerikawa et al. | |

FOREIGN PATENT DOCUMENTS

| | | |
|---|---|---|
| EP | 1 363 3363 A2 | 11/2003 |
| GB | 145691 | 7/1921 |
| GB | 868.784 | 5/1961 |
| GB | 2388741 A | 11/2003 |

OTHER PUBLICATIONS

PCT International Seach Report, PCT/US07/02068, May 2, 2008.

* cited by examiner

*Primary Examiner*—Derris H Banks
*Assistant Examiner*—Tai Nguyen
(74) *Attorney, Agent, or Firm*—Elaine C. Stracker

(57) ABSTRACT

The present invention provides a method of manufacturing piezoelectric transducers that improves performance by reducing the mechanical losses in the component interfaces. The method involves the epoxy impregnation and encapsulation of the components within the piezoelectric stack assembly. Impregnation is achieved by capillary action that results in a chemical bond. The encapsulation method results in an epoxy conformal coating that provides a high degree of protection from harsh operational environments and reduces the risk of high voltage electric breakdown.

3 Claims, 4 Drawing Sheets

METHODS OF MANUFACTURE OF A TRANSDUCER DEVICES ACTUATORS

CROSS REFERENCE TO RELATED APPLICATIONS

This application claims priority under 35 U.S.C. §119 from Provisional Application Ser. No. 60/761,178 filed Jan. 23, 2006, the disclosure of which is incorporated herein by reference.

FIELD OF THE INVENTION

The invention relates generally to the field of piezoelectric transducers. More specifically, the invention relates to a method of manufacture that improves energy conversion efficiency in ultrasonic and sonar transducers.

BACKGROUND

Sandwich-type ultrasonic transducers, also called Langevin transducers, are well known and established for the production of high intensity sonic and ultrasonic motion. GB 145,69 J of 1921 discloses a sandwich of piezoelectric material positioned between metal plates to produce high intensity ultrasound. Sandwich transducers utilizing a bolted stack transducer tuned to a resonant frequency and designed to the length of the half wavelength of the resonant frequency are described in GB 868,784. In general transducers of this type are usually configured to either radiate sound as in sonar transducers or to generate high amplitude ultrasonic motion to produce heat, cavitation, mechanical cutting, or a combination of these modalities.

Piezoelectric actuators are used to produce lower force relatively high displacements for use in applications such as diesel fuel injectors. They are typically constructed by stacking together multiple thin Piezo discs or rectangular plates that do not have a center bias bolt. The plate thickness is generally less than 1 mm thick. This type of assembly can also be used to convert mechanical energy into electrical energy and is used for energy harvesting applications. Piezo assemblies of this type are well known and described in detail in a book entitled "Piezoelectric Ceramics Properties and Applications" by J. W. Waanders and originally published by Philips Components in 1991.

The power limitation of a Langeven style transducer depends on the application and hitherto sonar transducers used for Navy and commercial applications have been limited by high values of electric field. This can result in either sudden catastrophic electric breakdown (corona discharge) or degradation of the piezo properties caused by increasing heat associated with the piezoelectric ceramic tan delta loss.

For applications such as industrial ultrasonic welding, medical tissue fragmentation, and dental teeth cleaning, the power limitation of a transducer is related to mechanical hysteresis losses within the piezo material and the joints between the individual piezo elements within a drive stack assembly. Therefore reducing the size of surgical tools like ultrasonic scalpels increases the power density and cyclic stress loss within the components. This results in excessive heat in the piezo material and the joints between the piezo elements. Increasing cyclic stress also causes a decrease in the resonant frequency and an increase in electrical impedance.

Wide-bandwidth Navy sonar transducers will operate at higher levels radiated acoustic power and increased bandwidth. Many of the new designs for these types of transducers have features like impedance matching layers that insulate the piezo drive stack from the direct cooling effects of the seawater environment. Thus, it is expected that the power limitation of these transducers will be heat generated by a combination of both electrical and mechanical losses.

While Langevin style piezo transducers have many applications, their performance is limited by the design and manufacturing processes for these systems. In particularly, there is significant performance degradation when the joints between the piezo elements of the transducer is not minimized allowing trapped air to be retained between the piezo elements.

Various methods have been applied to reduce performance losses due to non-optimal joint mating. One such method has been the application of an epoxy. Typically, the epoxy is mixed and then evacuated to remove entrapped air before pouring it into a mold that holds the stack assembly. Typically, the mating surfaces within the stack assembly are also prepared to improve the adhesion between the components. The metal end masses are microblasted, the silvered piezo surfaces are lightly burnished and the shim electrodes have a dull or matt surface finish. After applying the epoxy to the stack assembly, the epoxy is cured and the mold removed. While this method minimizes loss of bleed-off of stack pre-stress during operational use, bleed-off can still occur during the high temperature cure cycle. Increasing the power generally results in increased cyclic stress, which results in heating. The heat causes the epoxy to soften resulting in further joint losses. Moreover, the epoxy method involves a lot of separate processes and adds significant labor costs.

An alternative solution to using epoxy to fill the surface voids and defects is the use of 'crush washer' between adjacent piezoelectric elements, as disclosed in U.S. Pat. No. 5,798,599. On applying a static bias, the washers are crushed, filling surface voids and defects. Although the performance of the transducer stack improves, the use of such washers increases the expense of stack construction, making them unsuitable for mass produced units.

Two other methods of filing the surface voids and defects are disclosed in GB 2388741. These methods involve electroplating two soft conductive metal films onto the surface of a hard metal shim electrode material. In one method, the plating thickness is sufficiently thick so that is can cold flow and fill voids caused by polarizing distortions or other surface defects. In the other method, the piezo components are lapped flat and cold welded. The problems with these methods are that the cold flow process is difficult to control and results in a continuing bleed-off of center bolt bias force and the cold weld process has many different steps and the chemical etching of the piezo surface is difficult to control.

Dry joint technology has also been used to minimize performance loss, especially with transducers used for industrial applications such as ultrasonic welding and cleaning applications. Lapping and polishing produces a surface with a low roughness, typically on the order of approximately 10 nm. By reducing the surface roughness of parts in contact, the amount of air between the parts is minimized, thus decreasing the effect of any surface voids or defects. However, this process induces stress within the piezo component and causes distortion in the flatness of the mating surface affecting performance. This distortion increases with aging.

One method to address this distortion problem is to apply a thick silver electrode to mating surfaces of the piezo. Generally, multiple coats of silver are required to maintain coverage after the part is lapped flat. The silver coating is softer than the piezo and able to conform to small surface defects. However, this method significantly increases production time and manufacturing costs and is not considered practical for high volume applications.

Thus, there remains a need in the art for a low cost assembly method with improved performance. Specifically there is a need to reduce the mechanical and electrical losses associated with the joint of the piezo elements, and provide a high degree of protection from harsh operational environments.

SUMMARY

This invention primarily relates to a new method of assembling sonar and ultrasonic transducers that have Langevin style piezoelectric drive stacks. It can be applied to other types of transducers including segmented cylinders that are pre-stressed by winding pre-tensioned fiberglass filaments. It can also be applied to composite actuators that have external compression springs and energy harvesting stacks that are initially assembled without a pre-compression mechanism.

One aspect of the invention is a method of reducing the mechanical losses within a piezoelectric stack assembly by forming a silver surface on the piezo elements using a screen printable thick film silver that contains a glass frit combined with silver particles. The electrode is fired on at high temperature and the glass frit softens and embeds itself and the silver particles onto the ceramic. A separate metal shim electrode is interspaced between each piezo element and also between a piezo element and other components within the stack assembly. The metal shim electrode is plated with a softer metal, for example tin, that is preferably less than 5 microns thick. During the assembly process the piezo elements are compressed using sufficient force to- meld the thin plating layer of soft metal on the shim electrode into the silver surface of the piezo element. In one embodiment of this method, a low viscosity epoxy is then used to fill the remaining sub-micron voids between the piezo elements. When using an epoxy, impregnation is achieved by capillary action that results in a chemical bond.

A second aspect of this invention is a method of epoxy impregnation and encapsulation of the components within a piezoelectric stack assembly. The encapsulation method results in an epoxy coating that provides a high degree of protection from harsh operational environments. For high impedance transducers such as those used for Navy sonar applications higher voltages and power can therefore be applied without the risk of high voltage electric breakdown.

Figure 1:
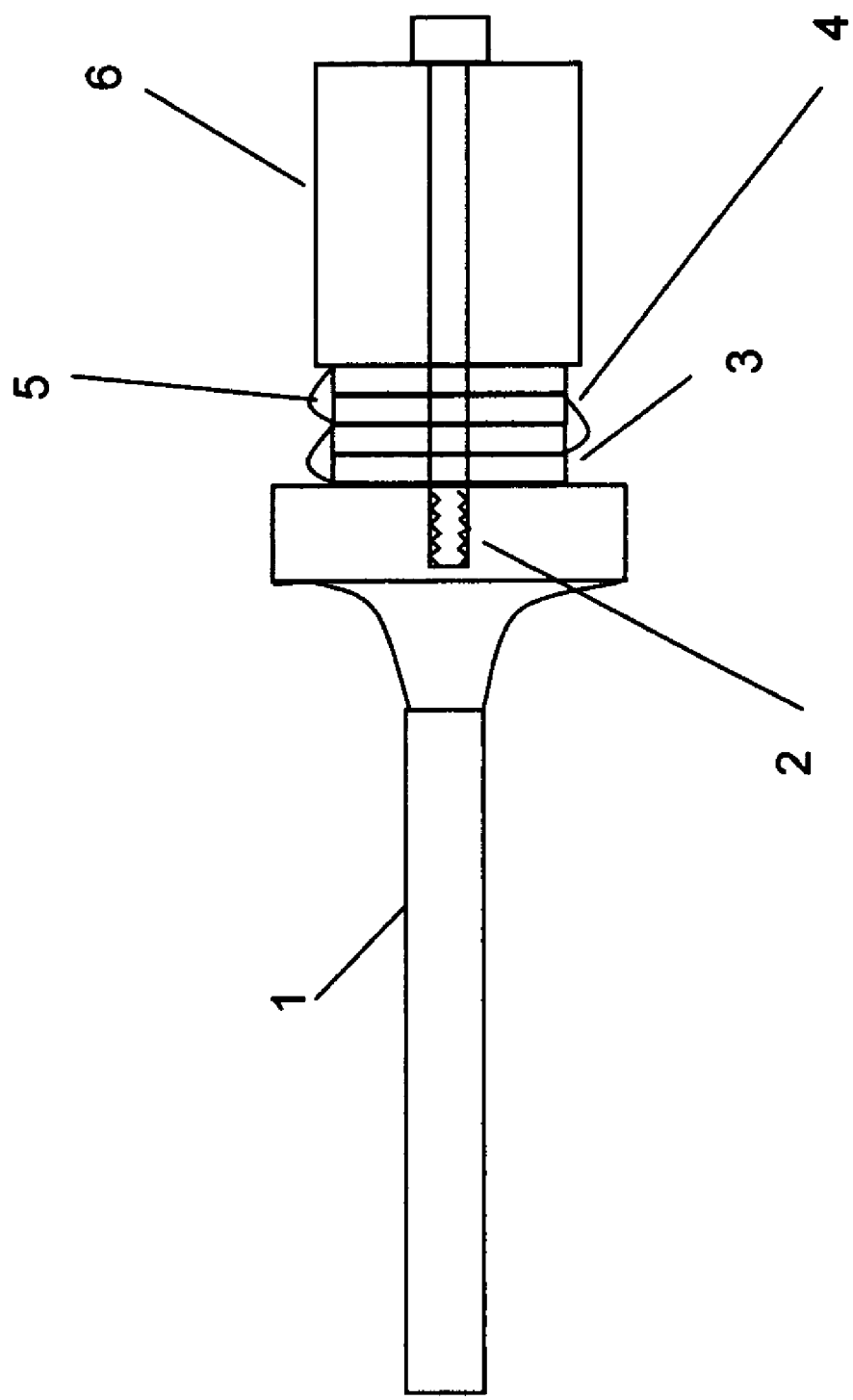
FIG. 1 is a diagram illustrating the components within a typical Langeven style ultrasonic transducer that is generally representative of those used for medical and industrial applications.

Reference will now be made in detail to embodiments of the present disclosure. While certain embodiments of the present disclosure will be described, it will be understood that it is not intended to limit the embodiments of the present disclosure to those described embodiments. To the contrary, reference to embodiments of the present disclosure is intended to cover alternatives, modifications, and equivalents as may be included within the spirit and scope of the embodiments of the present disclosure as defined by the appended claims.

DETAILED DESCRIPTION OF SPECIFIC EMBODIMENTS

Unless otherwise indicated, all numbers expressing quantities and conditions, and so forth used in the specification and claims are to be understood as being modified in all instances by the term "about."

In this application, the use of the singular includes the plural unless specifically stated otherwise. In this application, the use of "or" means "and/or" unless stated otherwise. Furthermore, the use of the term "including," as well as other forms, such as "includes" and "included," is not limiting. Also, terms such as "element" or "component" encompass both elements and components comprising one unit and elements and components that comprise more than one subunit unless specifically stated otherwise.

One aspect of the invention relates to a method of reducing the mechanical losses within a piezoelectric stack assembly by forming a silver surface on the piezo elements and by plating or coating the interspaced metal shim electrodes with a soft thin plating (or coating) material, which is then melded into the silver surface of the piezo element.

The shim electrode can comprise any convenient electrode material, including, for example, but not limitation, beryllium-copper, nickel, stainless steel, nickel/iron alloy, brass, and phosphor-bronze. In one preferred embodiment, the electrode is beryllium-copper.

The thickness of the metal shim ranges from 0.003 inches to 0.010 inches. In one preferred embodiment, the thickness is 0.003 inches. The layer of metal on the shim electrode can consist of any of a wide range of metals (such as, for example, but not limitation, tin or silver), or metal/metal or metal/nonmetal alloys (such as, for example, but not limitation, cobalt/gold, tin/lead, nickel/boron). In a preferred embodiment, the metal layer on the electrode is tin. The thickness of the layer of metal can vary, however, a thin layer, defined as 5 microns or less, is preferred.

During the assembly process the piezo elements are compressed using sufficient force to meld the thin plating layer of soft metal on the shim electrode into the silver surface of the piezo element.

To achieve an optimum low loss joint the surface finish and flatness of the piezo elements is critically important. In one embodiment of this invention, a silver coating is formed on a piezo element using a silver electrode. The silver electrode is preferably a screen printable thick film silver based on a glass frit combined with silver particles. The electrode is fired at high temperature and the glass frit softens and embeds itself and the silver particles onto the piezo ceramic surface. This is the most versatile and cost effective method of silver adhesion to a piezo surface. The thickness of the silver coating formed can vary between 5 microns and 15 microns. The hardness of the silver coating can also vary with some silver coatings being more compliant (less hard or softer) than others. Piezo rings that have an outside diameter of 15 mm would typically have a flatness tolerance of 8 microns on each mating surface and a surface finish or roughness of 1 micron. In an embodiment of this invention, the silvered surface of the piezo ring consists of a relatively compliant silver coating, which is not abraded or burnished.

Generally, there is considerable variability in the flatness of the silvered surfaces of discs and rings caused by a combination of the firing and polarizing process. Rings are stacked in a kiln, and rings at the bottom of the stack will distort differently from those at the top when subjected to a polarization stress. Until recently it has been difficult, expensive, and therefore impractical to measure the flatness and surface finish of each piezo component in a high volume production environment. Piezo Kinetics Inc, a piezo manufacturer based in Pennsylvania, uses a Corning Tropel Flatmaster that can measure flatness variation greater or equal to 2 microns. This machine also produces a visual image of the surface distortion pattern and roughness. In the one embodiment of this invention the surface finish or roughness of the silvered surface would be less than 1 micron and the flatness of parts with diameters up to 10 mm would be less than 5 microns, for parts between 10 and 25 mm the flatness should be less than 8 microns and for larger parts less than 10 microns.

Photographs of the mating surface of a typical piezo rings shows that there are localized high and low areas associated with sub-micron distortion patterns. The combination of the relatively compliant (soft) piezo silver coating and the metal coated shim electrode ensures good mechanical coupling over most of the mating surface.

In one embodiment of this method, a low viscosity epoxy is used to fill the sub-micron voids remaining between the piezo elements following assembly. Preferably, the epoxy is applied using a capillary action process.

For this method, functionally, the design of the shim electrode is important in that it has to provide good mechanical coupling as well as maximize capillary action. In the one embodiment of this method a beryllium copper shim electrode is plated with a thin layer of bright tin that is less than 5 microns thick. This has ideal properties in that it is soft enough to meld with the piezo silvered surface that has a typical surface finish of 1 micron; yet, it is hard enough to prevent cold flow when subjected to the high bias force and elevated temperatures, such as those encountered during steam sterilization in an autoclave. Experimental data indicates that the shinny surface of the tin results in lower losses than a mat finish. Thus, it is postulated that the shinny surface improves capillary action and thereby ensuring that the lower air filled non-metallic contact regions are filled with epoxy. The distance, h, that capillary action will draw the epoxy into a cylindrical tube for such a system is given by the formula:

$$h = \frac{2T}{\rho r g}$$

Where T=surface tension, $\rho$=density, r=radius of the tube, g=gravity force

The above equation is for a cylindrical defect but the relationships of the variables are the same for a flow with a noncircular cross section. In one preferred embodiment of this invention a low density, low viscosity epoxy is used, such as, for example, but not limitation, Emerson & Cuming STYCAST W19. This epoxy is especially formulated for applications that require both impregnation and encapsulation. The impregnation is achieved by heating the assembly and the epoxy, applying the epoxy while the assembly is hot and then facilitating capillary action by allowing the assembly to cool to room temperature. The encapsulation is achieved by allowing the epoxy to gel at a temperature between 21° C. and 38° C. for a period of approximately 12 hours. If required, a thicker coating can be achieved by applying a general purpose epoxy encapsulant, such as, for example, Emerson & Cuming STYCAST 2651. This general purpose epoxy system uses the same catalyst and cure cycle as W19 and can therefore be applied immediately after the W19 impregnation and subsequent cool down.

A diagram of a typical Langevin style transducer used for medical, dental, and industrial applications is shown in FIG. 1. An end effector would normally be attached to the distal tip of the horn 1. The assembly comprises the following components: a center bias bolt 2, piezoelectric ceramic rings 3, high voltage potential shim electrode 4, ground potential electrode 5, and rear mass 6. After the assembly of the components, a compressive force is applied to the assembly by bolt 2.

In one embodiment of the method, the epoxy can be applied to the completed assembly of the Langevin style transducer after the application of the compressive bias force. The disadvantage being that the internal surface of the piezoelectric rings is not coated with epoxy.

Figure 2:
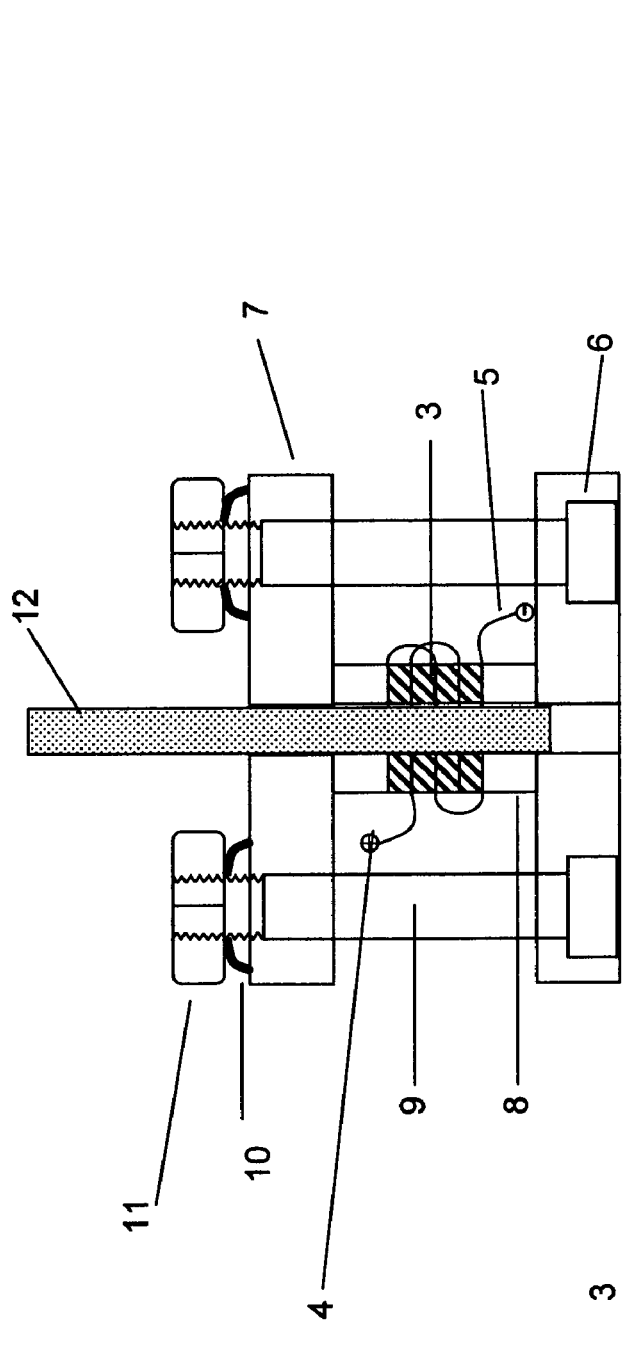
FIG. 2 is a diagram of an assembly fixture that is used to manufacture piezoelectric subassemblies prior to assembly within the transducer.

In a preferred embodiment of the method, the stack of piezo rings would be assembled prior to assembly in the transducer using as special fixture as shown in FIG. 2. The principal advantage of assembling the stack in a separate fixture prior to final assembly within the transducer is that the entire sub-assembly can be hermetically sealed with epoxy. In one embodiment of the invention, the piezo elements are donut shaped rings and both the interior and exterior surfaces are coated and impregnated with low viscosity epoxy. In another embodiment, the piezo elements are either cylindrical discs or rectangular plates. In yet another embodiment, the stack can include additional components such as electrical end insulators, end masses, and nodal mounting plates.

The following examples further illustrate the invention described herein and are in no way intended to limit the scope of the invention.

Figure 3:
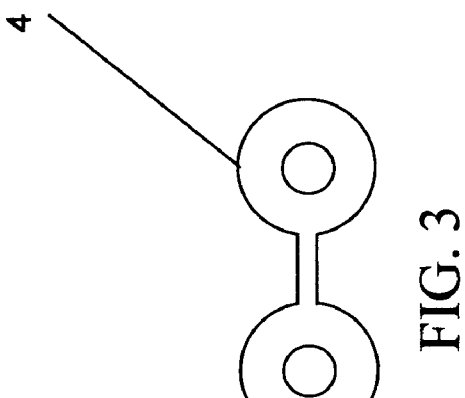
FIG. 3 is a diagram of one type of shim electrode that can be sandwiched between the piezoelectric rings within a stack assembly. The shim electrode provides an electrical connection between the pairs of rings within the stack. A separate electrode is used for the high potential and ground connection.
Figure 4:
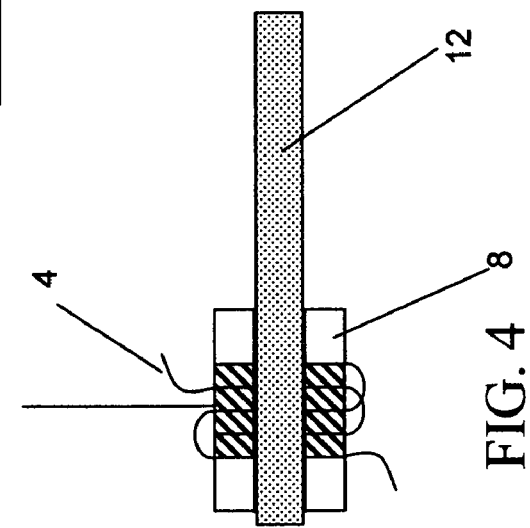
FIG. 4 is a diagram illustrating part of the assembly procedure.

A stack assembly using the fixture illustrated in FIG. 2 was made as follows:

A mold release agent (silicone spray) was applied to the mating surfaces of the top plate 7, and base plate 6 and to all surfaces of the tope and bottom spacers 8. The piezo rings 3 and shim electrodes 4 and 5 (and as further illustrated in FIG. 3.) were cleaned ultrasonically. The components were assembled over the alignment rod 12 starting with the bottom spacer 8, as illustrated in FIG. 4. The negative or ground potential shim electrode 5 was placed over rod 12. The bottom piezo ring 3 is then place negative side down. Next, the positive shim electrode 4 is positioned so that it is orientated approximately 90° from negative electrode 5. The next piezo ring 3 is assembled positive side down. Again, a positive shim electrode 4 is positioned so that it is orientated approximately 90° from negative electrode 5. The next piezo ring 3 was placed positive side down. The negative snake electrode 5 was bent and slid over the rod. The above sequences of assembling the remaining piezo rings and shim electrodes were repeated until the subassembly as shown in FIG. 4 was complete. The subassembly was located into the bottom plate 6 by inserting the alignment rod 12 into the central hole. The top plate 7 was slid over the alignment rod 12 as shown in FIG. 2. The top and bottom plate were assembled such that the four cap head screws 9 could be inserted. The screws were inserted through the base plate. Belleville washers 10 were placed over the portion of the bolts that extended above the top plate. Nuts 11 were threaded on and hand tightened. The nuts were tightened progressively and diagonal using a torque wrench. Torque was applied such that the stress in the piezo rings was between 25 MPa and 35 MPa. The center alignment rod 12 was removed. A sealing plug was inserted into the hole at the center of the base plate 6.

The assembly was placed in an oven and heated to a temperature of 140° C. For medical transducers that have to withstand steam sterilization temperatures the preferred temperature range is 135° C. to 140° C. (As known by those of skill in the art, for other types of transducers systems, the temperature used can vary from between 60° C. to 140° C.) This temperature was maintained for a period of one hour. The assembly was removed from oven and cooled down to room temperature. The assembly remained at room temperature for 12 hours. The assembly was again placed in oven and heated to a temperature of 77° C. for 30 minutes. (Again, as known by those of skill in the art, when assembling other types of transducer systems, the temperature used can vary from between 60° C. to 110° C.)

A low viscosity epoxy impregnant and casting resin, Emerson & Cuming STYCAST W19 was mixed. The epoxy was evacuated using a vacuum pump and bell jar for 7 minutes. The epoxy was placed in the oven and heated to a temperature of 77° C. This temperature was maintained for a period of approximately 5 minutes.

Both the pre-heated assembly and the epoxy were removed from the oven and the epoxy was immediately applied to the hot outer surface of the piezo rings in the stack assembly using a paint brush. The entire surface was coated. The assembly was placed in a vertical position and the epoxy was poured through the hole in the top plate such that it filled the central void. The epoxy was allowed to gel (approximately 8 hours at room temperature). The plug in the base plate was removed and the excess epoxy was allowed to drain away.

The assembly was placed in the oven for 16 hours at 77° C., until the epoxy was cured. (For W19 with catalyst 11 the recommended cure time is either 16 hours at 77° C. or 4 hours at 107° C. The catalyst 11 is also manufactured by Emerson & Cuming.) The assembly was removed from the oven, allowed to cool to room temperature, and the nuts 11 were sequentially loosened and the fixture disassembled. The spacers 8 were carefully removed from the ends of the piezo stack. The stack assembly was kept at room temperature for 24 hours and then electrically tested at low power (1 volt). The resonance frequency, coupling coefficient and capacitance were measured.

One of the performance advantages of assembling the stack using the method described above is that the stack will be virtually immune from bleed-off of pre-stress when assembled in the transducer. Practical experimental data of prior art dry assembly methods indicates that the initial pre-stress applied to a transducer stack assembly can bleed-off such that only 50% of the initial value is retained. This bleed-off is caused by the combination of relatively stiff bias bolts and the compaction of stack components. For example, a typical practical transducer might need a center bolt length extension of 25 microns to apply a stress of 35 MPa to a piezo stack of 4 rings. If each joint between the shim electrode and piezo silver surface compacts by 1.4 microns the applied stress will be reduced to half the initial value. Replacing the air in a joint with impregnated epoxy will prevent further compaction of the joints.

In an alternative embodiment the transducer was assembled as shown in FIG. 1. The epoxy was applied to the completed assembly after the application of the compressive force by bolt 2. The assembly method was as follows:

The components were assembled over the center bias bolt 2 as described above for the stack assembly fixture. Torque was applied to the bolt such that the resultant stress in the Piezo rings was between 25 MPa and 35 MPa. The assembly was placed in an oven and heated to a temperature between 137° C. and 140° C. This temperature was maintained for a period of greater than one hour. The assembly was removed from the oven and cooled down to room temperature. The assembly was maintained at room temperature for at least 12 hours. To compensate for component compaction that occurs during this heat cycle, the stack bias force was removed and reapplied to the required level. (Note; that alternatively the amount of bias force reduction can be estimated from a measurement of capacitance and additional preload applied. Typically the level of bias stress in the Piezo ring is between 25 MPa and 35 MPa.). Epoxy was applied over the external surface of the transducer stack assembly as described in the previous method for assembling the stack sub-assembly.

The process was validated using STYCAST W19 epoxy and the catalyst 11, both manufactured by Emerson & Cuming. This epoxy system has been especially formulated for impregnation and casting. However, other low viscosity resin systems could also be used and would give similar performance. The specification of some relevant properties of STYCAST W19 are specified by Emerson & Cuming as follows:

| | |
|---|---|
| Viscosity at 25° C. When cured with catalyst 11 | 0.2-0.3 Pa · s |
| Dielectric Strength | 15.6 kV/m |
| Volume Resistivity | $10^{12}$ Ohm · cm |
| Water Absorption after 24 hours at RT | 0.2% maximum |
| Service Temperature | −57° C. to +177° C. |

The process was also validated using the specified epoxy cure times and temperatures. Based on the recommendations found in the applications data sheet for STYCAST W19 and catalyst 11 the components and epoxy can be heated to a temperature range between 60° and 107° C. prior to impregnation. The recommended cure cycle is 16 hours at 77° C. or 4 hours at 107° C.

The heat cycle used to compact the components prior to the application of the epoxy should be applied for a period of greater than one hour. The temperature range can be between 60° C. and 140° C. The preload stress with the piezo elements can be between 25 MPa and 40 MPa.

Figure 5:
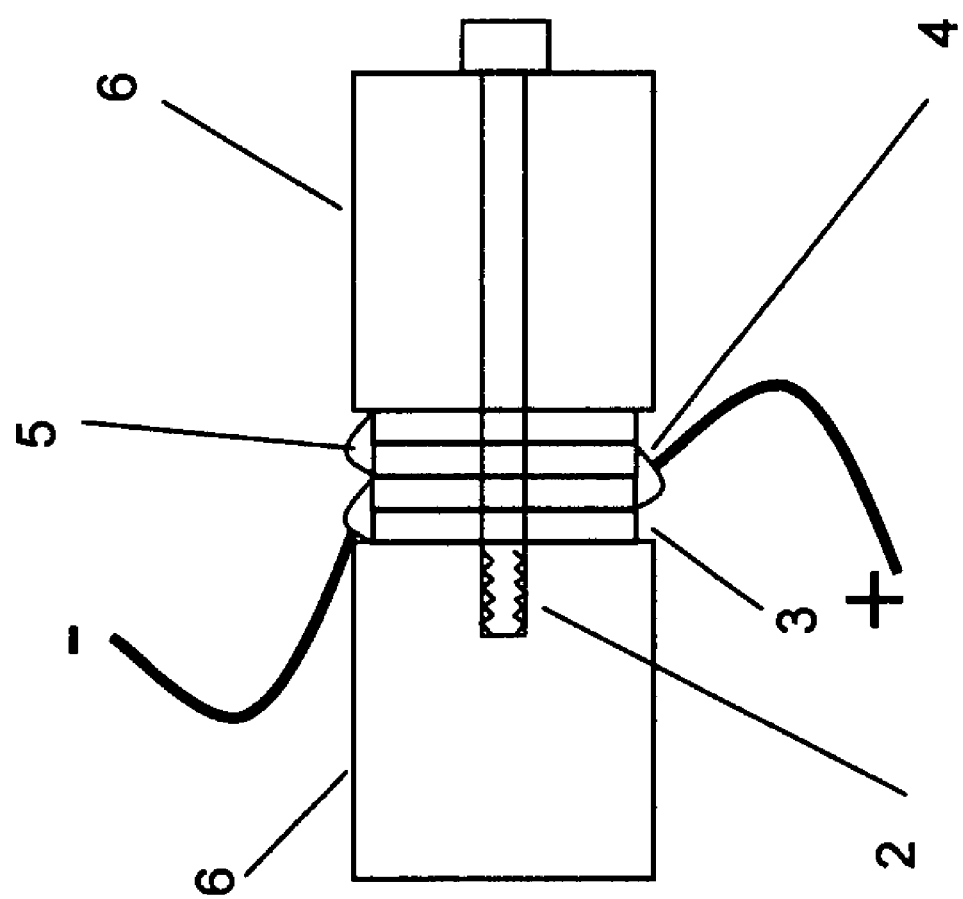
FIG. 5 is a diagram of a standard symmetrical dumbbell shaped Langeven style transducer that has historically been used to characterize material properties of piezo elements within a stack assembly.

Historically, standard symmetrical dumbbell shaped Langevin style transducers as illustrated in FIG. 5 have been used to characterize the material properties of piezo elements within the drive stack. The performance improvements relating to this invention have been validated using this type of standard test transducer that has a resonance frequency of approximately 40 kHz. These test transducers are typically used to evaluate the losses in the joints between the piezo elements and to life test high stress components like the center bias bolt. The symmetrical geometry is representative of the worst case scenario for a practical transducer design in that the node is located at the center of the piezo drive stack. The heat generated will be at a maximum value since it depends on the value of cyclic stress, frequency, and the length of the piezo stack in relation to the length of the thermally conductive end masses.

The performance improvements associated with this invention have been validated using 3 different diameter standard test transducers, 12.7 mm, 9.5 mm and 8 mm. The geometry of these test transducers is illustrated in FIG. 5. For many medical and industrial applications the transducer is required to operate in air at the maximum value of end effector velocity prior to being brought into contact with the load. The maximum value of end effector velocity is usually limited by heat that is generated within the Piezo drive stacks and specifically by the joints between the Piezo rings. Thus, performance can be benchmarked based on the end effector velocity for a constant input electrical power of 1 watt.

Figure 6:
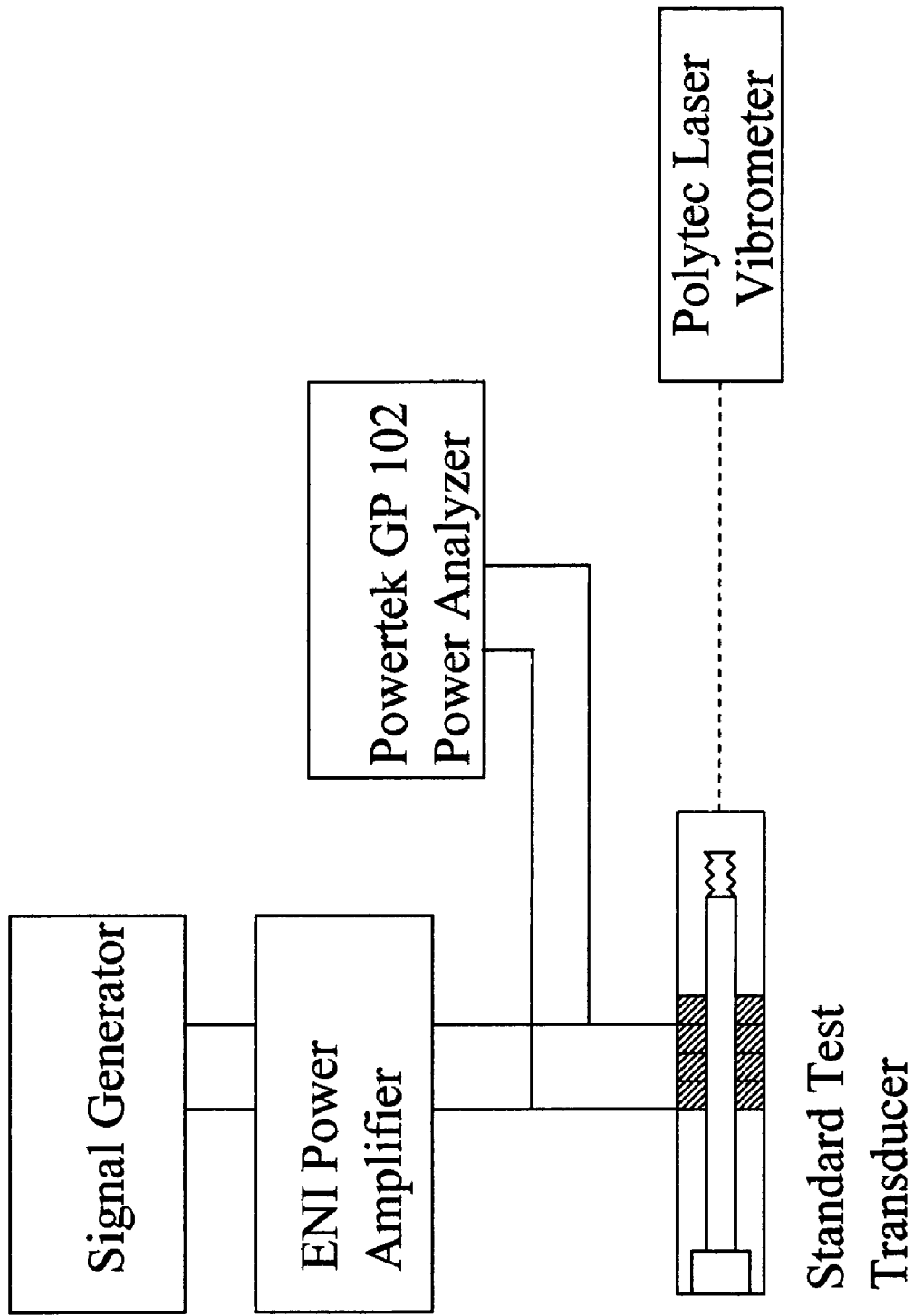
FIG. 6 is a block diagram showing the connection of a transducer to a system for the purposes of high power testing of the transducer.

FIG. 6 is a block diagram showing the connection of the standard test transducer to a system for the purposes of high power testing.

In the table below this invention has been assigned a trade mark name PiezoBond™. The dry assembly method is similar to the PiezoBond™ method except that the epoxy impregnation process was not implemented. The epoxy method in the table refers to a prior art assembly method whereby the mating surfaces within the stack assembly are coated with epoxy prior to assembly and the application of the bias force, however, this system does not have a metal coated shim electrode.

| | Input Power = 1 watt Frequency = 40 kHz | |
|---|---|---|
| | Front Face Velocity (m/s) | % Change in Resonant Frequency |
| Dry with plated shims | 0.65 | −1.3 |
| Epoxy | 0.66 | −0.75 |
| PiezoBond ™ | 0.88 | −0.1 |

The elastic power loss caused by the internal friction within the components of a piezoelectric transducer can be calculated by dividing the structure into a number of elements. Ideally each element should be short enough such that the stress is reasonably constant. The elemental power loss can then be calculated from the formula:

$$P_r(\text{thin element}) = \frac{\omega \sigma_M^2 l S}{2QE}$$

$P_r$ = Power loss  $\sigma_M$ = peak cycle stress
$C$ = sound velocity  $S$ = cross section area
$E$ = Young's modulus  $l$ = length of thin element
$\omega = 2 \times 3.14159 \times \text{frequency}$ For a relatively simple configuration such as the standard test transducer it is possible to use a computer model to calculate the elemental power loss and the accumulated total value. By iteration and changing the Q of the component material, the model can be used to obtain a "best-fit" with measured data. In practice the Q of the metal end mass components is typically greater than 7000, whereas the Q of a single piezo ring and the adjacent joint is typically between 100 and 400. This results in most of the heat being generated in the piezoelectric ceramic stack. The iterative method therefore involves changing the Q of a piezo ring and joint combination until the calculated and measured power are in close agreement. The value of Q for a piezo/joint combination is therefore an ideal benchmark for performance comparison. However the mechanical losses within a piezoelectric ceramic stack tend to increase in a non-linear manner at very high values of cyclic stress and this will reduce the value of Q for the piezo/joint combination.

Standard test transducers have been assembled using a variety of prior art techniques that are in common usage. They have been driven at a constant velocity of 1 m/s and the input power has been measured. The measured data was input for a computer model that determined the value of Q for the piezo ring/joint combination relating to the input power. The results are tabulated below.

| | Q (piezo/joint combination) |
|---|---|
| Dry | 157 |
| Low viscosity Epoxy | 119 |
| PiezoBond ™ | 378 |

From the above tabulated results it can bee seen that this invention, PiezoBond™, reduces the power loss by at least a factor of three over other methods.

Also, as a comparison, Navy sonar transducers are typically assembled using a filled epoxy such as Armstrong A2/A. A transducer was assembled using this filled epoxy and the Q of the piezo/joint combination was 176. The PiezoBond™ system also performed significantly better than using a filled epoxy system. PiezoBond™ reduces the power loss by at least a factor of two over the filled epoxy method.

Another measured performance improvement relates to the epoxy impregnation and encapsulation process that results in a conformal coating of the exposed external an internal shim electrode electrical connections. This is especially important for Navy sonar transducers that typically operate at very high voltage. A stack assembly manufactured using the methods described in this invention withstood an electric field of 11.8 kV/cm without breakdown. Navy transducer designs are currently limited to about 4.0 kV/cm.

Although the invention has been described with respect to particular embodiments, it will be apparent to those skilled in the art that various changes and modifications can be made without departing from the invention.

What is claimed is:

1. A method of manufacturing a transducer comprising the steps of:
   a) forming a silver coating on piezo elements within the transducer using print screening;
   b) melding a tin coated beryllium-copper shim electrode to the silver coating;
   c) heating the piezo elements with the melded shim electrode;
   d) impregnating the piezo elements by capillary action with a hot low viscosity epoxy;
   e) coating exterior surfaces of the piezo elements with the epoxy; and
   f) curing the epoxy.

2. The method of claim 1, wherein the silver coating has a surface finish of less than 1 micron.

3. The method of claim 2, wherein the tin coating is less than 5 microns.

* * * * *